US011233117B2

(12) United States Patent
Kuo et al.

(10) Patent No.: US 11,233,117 B2
(45) Date of Patent: Jan. 25, 2022

(54) RING STRUCTURE FOR FILM RESISTOR

(71) Applicant: Taiwan Semiconductor Manufacturing Co., Ltd., Hsin-Chu (TW)

(72) Inventors: Chun-Tsung Kuo, Tainan (TW); Jiech-Fun Lu, Madou Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/789,839

(22) Filed: Feb. 13, 2020

(65) Prior Publication Data
US 2021/0134940 A1 May 6, 2021

Related U.S. Application Data

(60) Provisional application No. 62/928,545, filed on Oct. 31, 2019.

(51) Int. Cl.
*H01L 49/02* (2006.01)
*H01L 21/768* (2006.01)

(52) U.S. Cl.
CPC ........ *H01L 28/24* (2013.01); *H01L 21/76802* (2013.01); *H01L 21/76831* (2013.01); *H01L 21/76877* (2013.01)

(58) Field of Classification Search
CPC ..... H01L 28/20; H01L 28/24; H01L 23/5228; H01L 21/76802; H01L 21/67877
See application file for complete search history.

(56) References Cited

U.S. PATENT DOCUMENTS

| | | | | |
|---|---|---|---|---|
| 5,466,484 A * | 11/1995 | Spraggins | ........... | H01L 27/0802 438/385 |
| 7,633,373 B1 * | 12/2009 | Johnson | .................. | H01C 7/006 257/E21.004 |
| 8,193,603 B2 * | 6/2012 | Klatt | ................. | H01L 21/76895 257/506 |
| 8,368,167 B1 * | 2/2013 | Urienza | .............. | H01L 27/0814 257/484 |
| 8,445,353 B1 * | 5/2013 | Raghavan | ........... | H01L 23/5228 438/381 |
| 8,642,438 B2 * | 2/2014 | Lee | ..................... | H01L 27/0629 438/382 |
| 2006/0006981 A1 | 1/2006 | Seo et al. | | |
| 2006/0118908 A1 * | 6/2006 | Erickson | ................. | H01L 28/20 257/536 |

(Continued)

FOREIGN PATENT DOCUMENTS

JP 2010034492 A 2/2010

*Primary Examiner* — Zandra V Smith
*Assistant Examiner* — John M Parker
(74) *Attorney, Agent, or Firm* — Eschweiler & Potashnik, LLC

(57) ABSTRACT

Various embodiments of the present disclosure are directed towards an integrated chip including a resistor structure. A resistive layer overlies a substrate. The resistor structure overlies the substrate. The resistor structure includes a resistor segment of the resistive layer and conductive via structures overlying the resistor segment. A ring structure encloses the resistor structure. The ring structure extends continuously from a first point above the conductive structures to a second point below a bottom surface of the resistive layer.

20 Claims, 12 Drawing Sheets

(56) References Cited

U.S. PATENT DOCUMENTS

| | | |
|---|---|---|
| 2010/0308436 A1 | 12/2010 | Nanjo |
| 2011/0291225 A1 | 12/2011 | Klatt |
| 2011/0309466 A1 | 12/2011 | Nanba |
| 2013/0093055 A1* | 4/2013 | Lee .................. H01L 27/016 257/536 |
| 2014/0084381 A1 | 3/2014 | Yeh et al. |
| 2015/0162396 A1* | 6/2015 | Yagi .................. H01L 23/5223 257/532 |
| 2015/0206964 A1 | 7/2015 | Cheng et al. |
| 2019/0181089 A1 | 6/2019 | Karino et al. |

* cited by examiner

RING STRUCTURE FOR FILM RESISTOR

REFERENCE TO RELATED APPLICATION

This Application claims the benefit of U.S. Provisional Application No. 62/928,545, filed on Oct. 31, 2019, the contents of which are hereby incorporated by reference in their entirety.

BACKGROUND

Modern integrated chips use a wide range of devices to achieve varying functionalities. In general, integrated chips comprise active devices and passive devices. Active devices include transistors (e.g., MOSFETS), while passive devices include inductors, capacitors, and resistors. Resistors are widely used in many applications such as RC circuits, power drivers, power amplifiers, RF applications, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
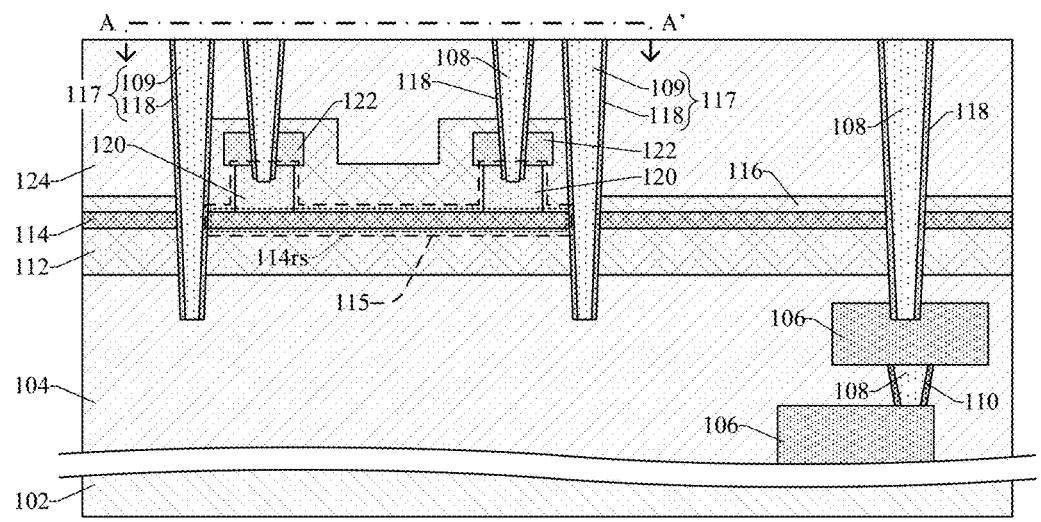
FIG. 1 illustrates a cross-sectional view of some embodiments of an integrated chip having a ring structure laterally enclosing a resistor structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may have passive devices disposed over/within a substrate. The passive devices may, for example, include inductors, resistors, capacitors, diodes etc. One common type of resistor used in an integrated chip is a polysilicon resistors. However, the polysilicon resistor may face a number of issues, such as break down issues. For example, by virtue of the material of polysilicon resistors, a temperature coefficient of resistance (TCR) of the polysilicon resistor is relatively high (e.g., about 990 ppm/C). This in turn may result in a change in resistance of the polysilicon resistance over time, especially in high voltage applications, where high heat may accumulate at the polysilicon resistor due to the high voltage. Further, the relatively high TCR may result in a low breakdown voltage, thereby resulting in device failure of the integrated chip.

In some embodiments, a resistor structure may be fabricated such that it comprises silicon chromium (SiCr). By virtue of the SiCr material, the resistor structure may have a reduced TCR (e.g., less than about 50 ppm/C), such that a change in resistance due to heat may be mitigated. However, a method for forming the resistor structure may be complex. For example, the method may include forming a resistive layer over a substrate, where the resistive layer comprises SiCr. A conductive contact layer is formed over the resistive layer and a dielectric structure is formed over the conductive contact layer. Subsequently, a first patterning process is performed on the resistive layer to form one or more resistor segments, such that the one or more resistor segments are laterally offset from one another. A second patterning process is performed to remove a portion of the conductive contact layer and the dielectric structure. A third patterning process is performed on the conductive contact layer to define one or more conductive contacts over each resistor segment, thereby defining a plurality of resistor structures. In addition, conductive vias are formed over the conductive contacts. By virtue of the method utilizing at least three patterning processes, time and cost associated with the fabrication are adversely increased.

The present disclosure relates to a method for simplifying the fabrication of a resistor structure by reducing the number of patterning process utilized during the fabrication. For example, the method may include forming a resistive layer (e.g., comprising SiCr) over a substrate, forming a conductive contact layer over the resistive layer, and forming a dielectric structure over the conductive contact layer. Subsequently, a first patterning process is performed to remove at least a portion of the dielectric structure and the conductive contact layer. Further, a second patterning process is performed on the conductive contact layer to form a plurality of conductive contacts over the resistive layer. Conductive vias are formed over the conductive contacts and one or more ring structures are formed over the substrate. The ring structures extend through the resistive layer, thereby defining a plurality of resistor segments that are laterally offset and electrically isolated from one another. In addition, the ring structures respectively surround a corresponding set of conductive contacts, thereby defining one or more resistor structures. The conductive vias and the ring structures may be formed concurrently with one another. This, in turn, reduces a number of patterning processes utilized to form the resistor structures, thereby decreasing costs and time to form the resistor structures.

FIG. 1 illustrates a cross-sectional view of some embodiments of an integrated chip 100 that includes a resistor structure 115.

The resistor structure 115 overlies a substrate 102. A first inter-level dielectric (ILD) structure 104 overlies the substrate 102. A first insulator layer 112 overlies the first ILD structure 104 and a second insulator layer 116 overlies the first insulator layer 112. Further, a resistive layer 114 is disposed between the first insulator layer 112 and the second insulator layer 116. A second ILD structure 124 overlies the second insulator layer 116. A plurality of conductive wires 106 and a plurality of conductive vias 108 are disposed within the first and/or second ILD structures 104, 124 and overlie the substrate 102. The conductive wires and/or vias 106, 108 are configured to electrically couple devices disposed within the integrated chip 100 to one another. In some embodiments, the resistor structure 115 may, for example, be used in RC circuits, power drivers, power amplifiers, RF applications, analog to digital converters (ADCs), and/or digital to analog converters (DACs).

Contact structures 120 are disposed over the resistive layer 114. A dielectric structure 122 directly overlies each of the contact structures 120. In some embodiments, the resistor structure 115 includes the contact structures 120 and a resistor segment 114rs of the resistive layer 114 that is disposed between sidewalls of a ring structure 117. In some embodiments, the resistive layer 114 may, for example, be or comprise silicon chromium (SiCr), such that a TCR of the resistor structure 115 is relatively low. Other materials for the resistive layer 114 are, however, amenable. In some embodiments, one or more conductive vias 108 overlying the resistive layer 114 may be surrounded by a first liner 118. In further embodiments, the first liner 118 may be configured as an isolation liner, such that conductive vias 108 that extend through an entire thickness of the resistive layer 114 are electrically isolated from the resistive layer 114. In some embodiments, the first liner 118 may, for example, be or comprise tetra-ethyl-ortho-silicate (TEOS) (e.g., plasma enhanced TEOS, low particle TEOS, etc.), an oxide (e.g., silicon oxide, silicon dioxide, etc.), a nitride, another suitable dielectric material, or any combination of the foregoing. In further embodiments, a second liner 110 laterally surrounds a conductive via 108 underlying the resistor structure 115. In some embodiments, the second liner 110 may be configured as a conductive adhesion structure and/or a buffer layer.

The ring structure 117 (in some embodiments, referred to as an isolation structure) laterally encloses the resistor structure 115. In some embodiments, the ring structure 117 may comprise a conductive body 109 and the first liner 118. The conductive body 109 laterally encloses the resistor structure 115 and the first liner 118 is disposed around sidewalls of the conductive body 109. In some embodiments, this ensures the conductive body 109 is laterally offset from the resistive layer 114 by a non-zero distance. Thus, the first liner 118 is configured to electrically isolate the conductive body 109 from the resistor structure 115. In further embodiments, the ring structure 117 defines an outer perimeter of the resistor segment 114rs of the resistive layer 114. In some embodiments, the conductive body 109 and the first liner 118 of the ring structure 117 extends completely through a thickness of the resistive layer 114. In yet further embodiments, the conductive body 109 comprises a same material as the conductive vias 108.

In some embodiments, during formation of the integrated chip 100, the conductive vias 108 directly overlying the contact structures 120 and/or extending through the resistive layer 114 may be formed concurrently with the ring structure 117. By forming the ring structure 117 concurrently with the conductive vias 108, a cost and complexity of fabricating the integrated chip 100 may be reduced. Further, because the ring structure 117 extends through an entire thickness of the resistive layer 114, it defines an outer perimeter of the resistor segment 114rs. Additionally, by virtue of the ring structure 117 comprising the first liner 118 and laterally enclosing the resistor segment 114rs, the resistor segment 114rs may be isolated from other segments and/or a peripheral region of the resistive layer 114.

Figure 2:
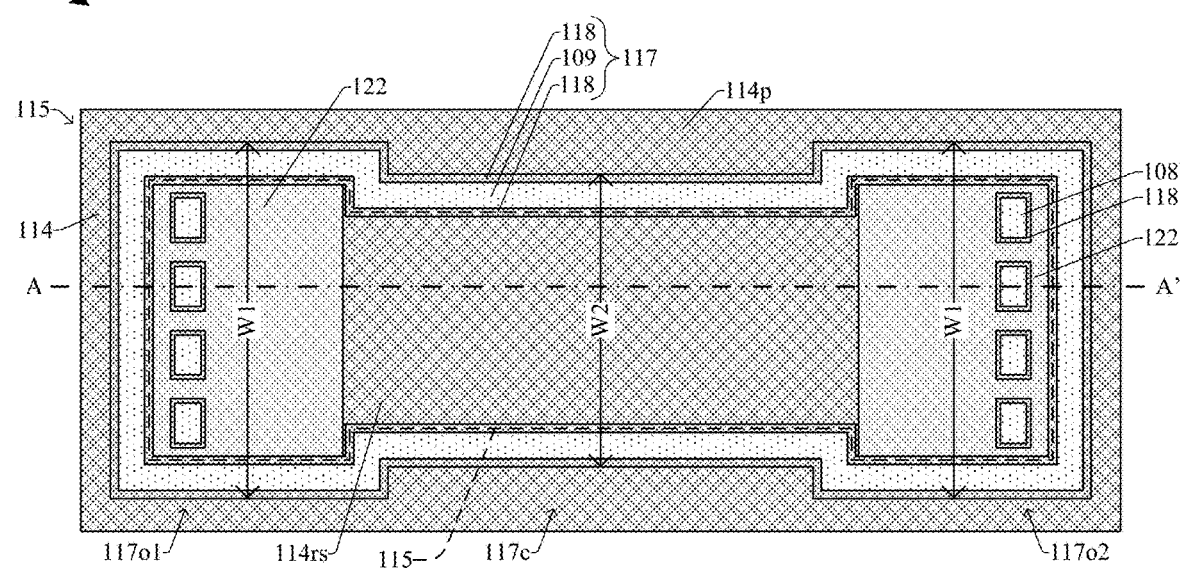
FIG. 2 illustrates a top view of some alternative embodiments of the integrated chip of FIG. 1 according to the line A-A'.

FIG. 2 illustrates a top view 200 of some alternative embodiments of the integrated chip 100 of FIG. 1 taken along line A-A'. For clarity, the second insulator layer 116 and the second ILD structure 124 overlying the resistive layer 114 are omitted from the top view 200 of FIG. 2.

The ring structure 117 laterally encloses the resistor segment 114rs of the resistive layer 114. Thus, the resistor segment 114rs is defined between inner sidewalls of the ring structure 117. Further, an outer perimeter of the resistor segment 114rs is defined by an inner perimeter of the ring structure 117. In addition, the first liner 118 is disposed along opposing sidewalls of the conductive body 109, such that the first liner 118 may isolate the resistor segment 114rs from the conductive body 109 and/or a peripheral region 114p of the resistive layer 114. Further, a contact structure (120 of FIG. 1) may be disposed between each dielectric structure 122 and the resistor segment 114rs. Multiple conductive vias 108 may extend through an entire thickness of the dielectric structures 122 and directly contact a corresponding contact structure (120 of FIG. 1). In some embodiments, the ring structure 117 may have a ring-shape, such as a rectangular shape, a square shape, a circular shape, an ellipse shape, or another corresponding shape, such that the ring structure 117 laterally encloses the resistor structure 115. In some embodiments, the ring structure 117 comprises a first outer region 117o1, a second outer region 117o2, and a center region 117c that is disposed between the first and second outer regions 117o1, 117o2. The first and second outer regions 117o1, 117o2 have a first width W1 and the center region 117c has a second width W2 less than the first width W1.

Figure 3:
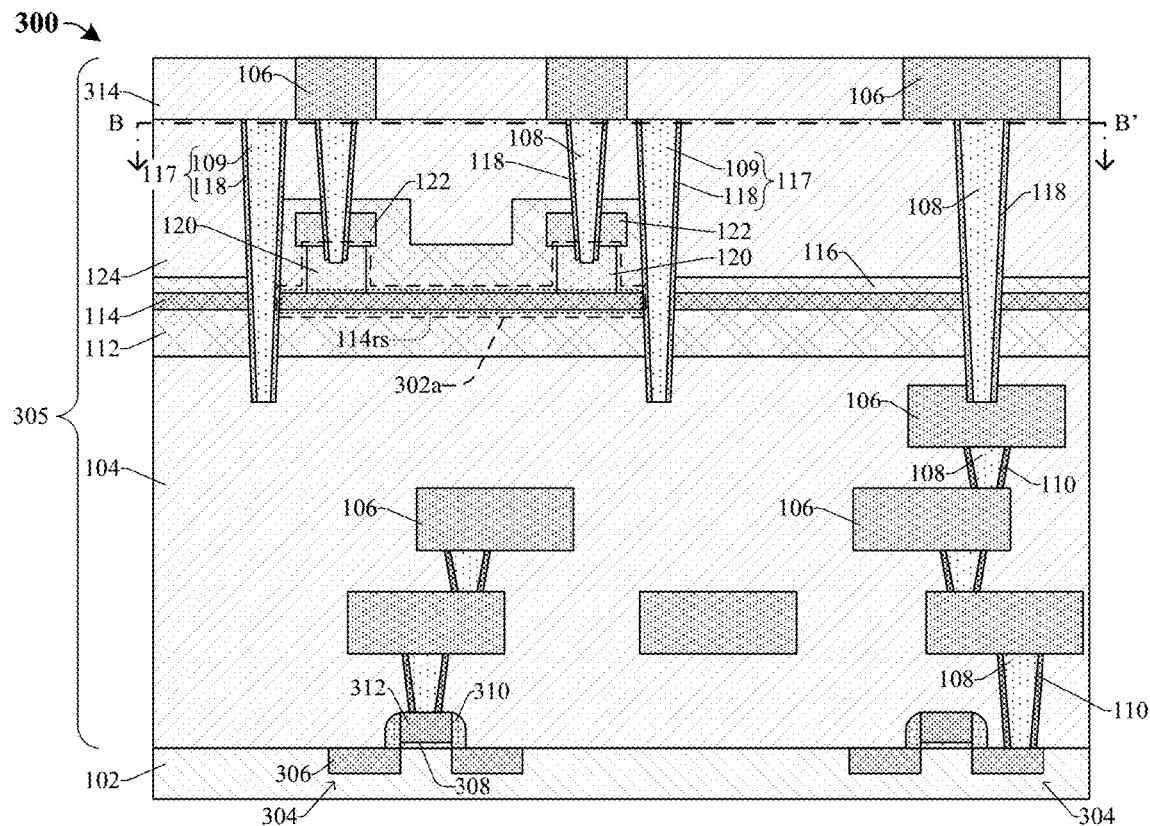
FIG. 3 illustrates a cross-sectional view of some embodiments of an integrated chip having a resistor structure disposed within an interconnect structure.

FIG. 3 illustrates a cross-sectional view of some embodiments of an integrated chip 300 that includes a first resistor structure 302a disposed within an interconnect structure 305.

The interconnect structure 305 overlies a substrate 102. In some embodiments, the substrate 102 may, for example, be or comprise a semiconductor substrate material (e.g., silicon), a bulk silicon substrate (e.g., bulk silicon), a silicon-on-insulator (SOI) substrate, or another suitable substrate material. The interconnect structure 305 includes a plurality of dielectric layers, a plurality of conductive wires 106, and a plurality of conductive vias 108. The plurality of conductive wires and/or vias 106, 108 are disposed within the plurality of dielectric layers. In some embodiments, the plurality of conductive wires 106 and/or the conductive vias 108 may be configured to electrically couple devices disposed within and/or over the substrate 102 to one another. In some embodiments, the conductive wires 106 and/or the conductive vias 108 may, for example, be or comprise aluminum, copper, tungsten, another suitable conductive material, or any combination of the foregoing.

A plurality of semiconductor devices 304 may be disposed within and/or over the substrate 102. In some embodiments, the semiconductor devices 304 may be configured as transistors. In such embodiments, the semiconductor devices 304 each comprise source/drain regions 306, a gate dielectric layer 308, a gate electrode 312, and a sidewall spacer structure 310. The gate electrode 312 overlies the gate dielectric layer 308 and the source/drain regions 306 are disposed within the substrate 102 on opposing sides of the gate electrode 312. A first inter-level dielectric (ILD) structure 104 overlies the substrate 102. In some embodiments, the first ILD structure 104 may, for example, be or comprise silicon dioxide, a low-k dielectric material, another suitable dielectric material, or any combination of the foregoing. A first insulator layer 112 overlies the first ILD structure 104. A resistive layer 114 overlies the first insulator layer 112 and a second insulator layer 116 overlies the resistive layer 114. In some embodiments, the first and/or second insulator layers 112, 116 may, for example, respectively be or comprise an oxide, such as silicon dioxide, or another suitable dielectric material. The first and/or second insulator layers 112, 116 may be configured to dissipate heat generated by the first resistor structure 302a during operation of the integrated chip 300. A second ILD structure 124 overlies the second insulator layer 116. In some embodiments, the second ILD structure 124 may, for example, be or comprise an oxide, such as silicon dioxide, a low-k dielectric material, another suitable dielectric material, or any combination of the foregoing.

Contact structures 120 are disposed over a resistor segment 114rs of the resistive layer 114. In some embodiments, the contact structures 120 may, for example, be or comprise titanium nitride, tantalum nitride, another suitable material, or any combination of the foregoing and/or may comprise a different material than the resistive layer 114. A dielectric structure 122 directly overlies each of the contact structures 120. In some embodiments, the dielectric structure 122 may, for example, be or comprise silicon oxynitride, silicon oxycarbide, another suitable dielectric material, or any combination of the foregoing. In some embodiments, the first resistor structure 302a includes the contact structures 120 and the resistor segment 114rs of the resistive layer 114 that is disposed between sidewalls of a ring structure 117. In some embodiments, the resistive layer 114 may, for example, be or comprise silicon chromium (SiCr), such that a TCR of the first resistor structure 302a is relatively low (e.g., less than about 50 ppm/C). In yet further embodiments, the resistive layer 114 may, for example, be or comprise titanium nitride, silicon chromium, nickel chromium aluminum, tantalum nitride, another suitable material, or any combination of the foregoing. In some embodiments, one or more conductive vias 108 overlying and/or extending through the resistive layer 114 may be surrounded by a first liner 118. In further embodiments, the first liner 118 may be configured as an isolation liner, such that conductive vias 108 that extend through an entire thickness of the resistive layer 114 may be electrically isolated from the resistive layer 114. In some embodiments, the first liner 118 may, for example, be or comprise tetra-ethyl-ortho-silicate (TEOS) (e.g., plasma enhanced TEOS, low particle TEOS, etc.), an oxide (e.g., silicon oxide, silicon dioxide, etc.), a nitride, another suitable dielectric material, or any combination of the foregoing. In further embodiments, a second liner 110 laterally surrounds conductive vias 108 underlying the first resistor structure 302a. In some embodiments, the second liner 110 may be configured as a conductive adhesion structure and/or a buffer layer. In some embodiments, the second liner 110 may, for example, be or comprise titanium nitride, tantalum nitride, another suitable material, or any combination of the foregoing.

The ring structure 117 laterally encloses the resistor segment 114rs of the resistive layer 114. The ring structure 117 comprises a conductive body 109 and the first liner 118. The conductive body 109 laterally encloses the first resistor structure 302a and the first liner 118 is disposed around sidewalls of the conductive body 109. This ensures the conductive body 109 is laterally offset from the resistive layer 114 by a non-zero distance. Thus, the first liner 118 is configured to electrically isolate the conductive body 109 from the first resistor structure 302a. In further embodiments, the ring structure 117 defines an outer perimeter of the resistor segment 114rs of the resistive layer 114. In some embodiments, the conductive body 109 and the first liner 118 of the ring structure 117 extends completely through a thickness of the resistive layer 114. In some embodiments, the conductive body 109 may, for example, be or comprise aluminum, copper, tungsten, titanium nitride, tantalum nitride, another suitable conductive material, or any combination of the foregoing. Further, an upper ILD layer 314 overlies the second ILD structure 124. Conductive wires 106 are disposed within the upper ILD layer 314 and overlie corresponding conductive vias 108.

Figure 4:
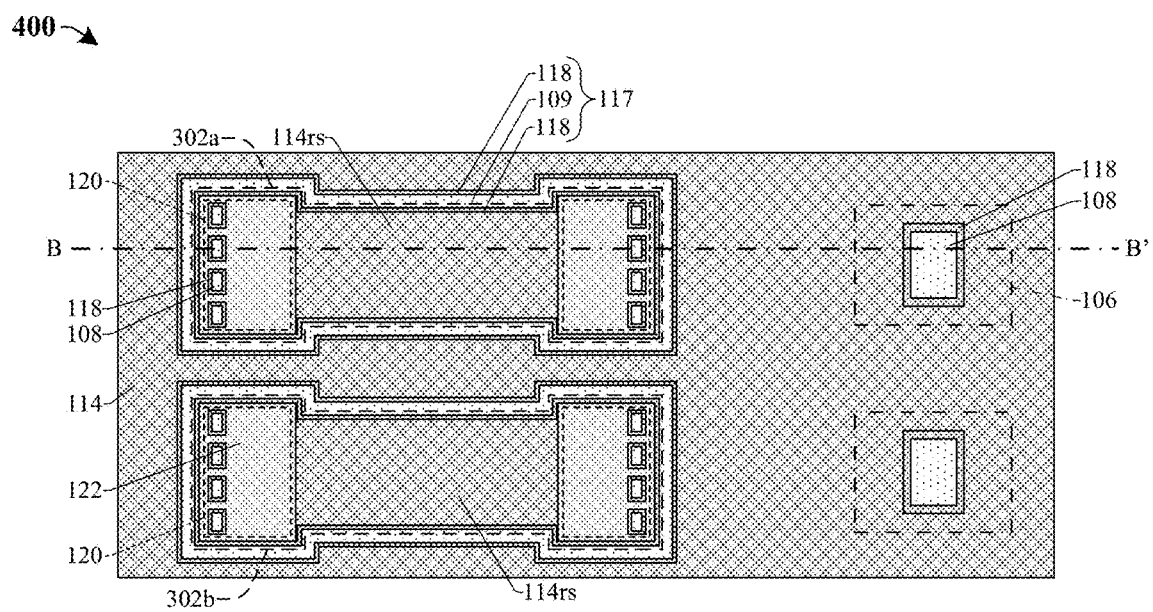
FIG. 4 illustrates a top view of some alternative embodiments of the integrated chip of FIG. 3 according to the line B-B'.

FIG. 4 illustrates top view 400 of some alternative embodiments of the integrated chip 300 of FIG. 3 taken along line B-B'. For clarity, the second insulator layer 116 and the second ILD structure 124 overlying the resistive layer 114 are omitted from the top view 400 of FIG. 4.

As illustrated in FIG. 4, the first resistor structure 302a is laterally offset from a second resistor structure 302b. In some embodiments, the second resistor structure 302b is configured as the first resistor structure 302a, such that the second resistor structure 302b includes contact structures 120 and a resistor segment 114rs of the resistive layer 114 that is disposed between sidewalls of a ring structure 117. The contact structures 120 are disposed between the dielectric structure and the resistive layer 114.

FIGS. 5A-5B through 13A-13B illustrate a series of various views of some embodiments of a method for forming an integrated chip having a resistor structure overlying a substrate. Figures with a suffix of "A" illustrate a cross-sectional view of the integrated chip during various formation processes. Figures with a suffix of "B" illustrate respective top views taken along the line C-C' of Figs. with a suffix of "A". Although the various views shown in FIGS. 5A-5B through 13A-13B are described with reference to a method of forming the integrated chip, it will be appreciated that the structures shown in FIGS. 5A-5B through 13A-13B are not limited to the method of formation but rather may stand alone separate of the method.

Figure 5A:
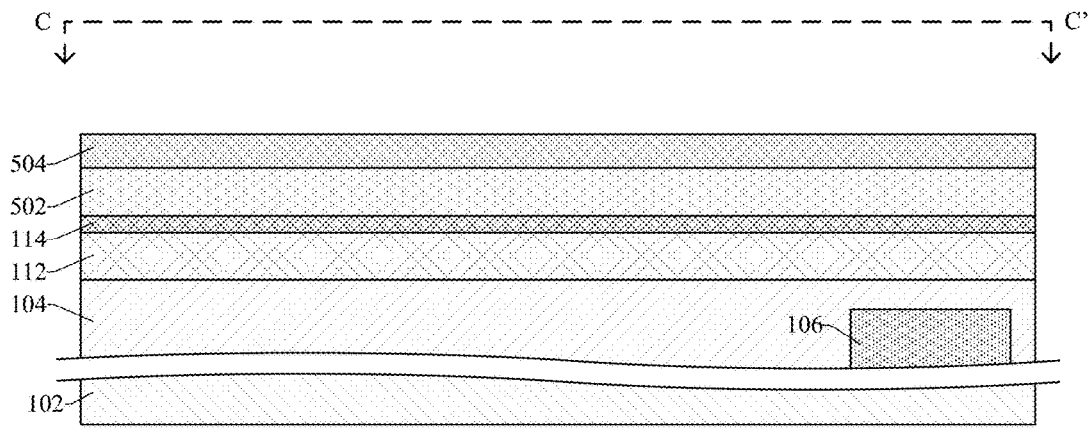
FIGS. 5A-5B through 13A-13B illustrate a series of various views of some embodiments of a method for forming an integrated chip having a resistor structure overlying a substrate.
Figure 5B:
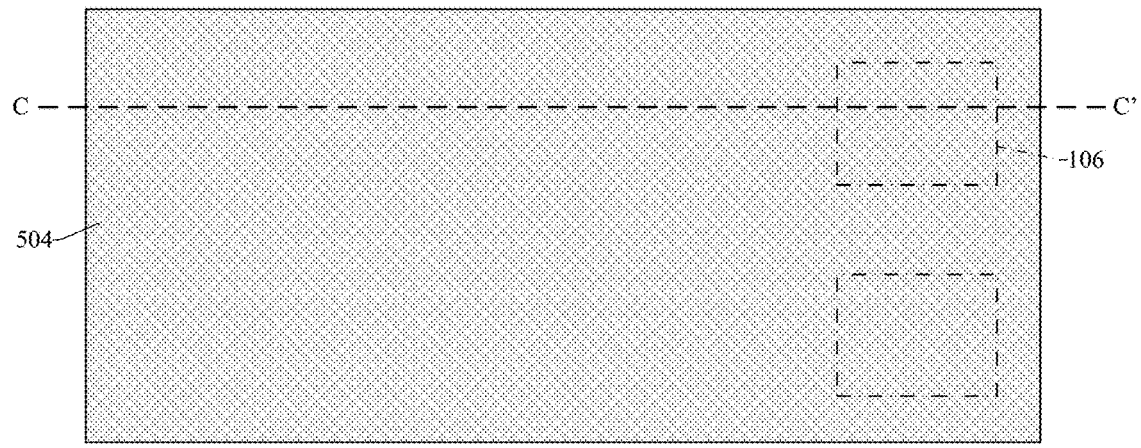

As shown in cross-sectional view 500a and top view 500b of FIGS. 5A-5B, a substrate 102 is provided and a first inter-level dielectric (ILD) structure 104 is formed over the substrate 102. In some embodiments, the substrate 102 may, for example, be a bulk substrate (e.g., a bulk silicon substrate), a silicon-on-insulator (SOI) substrate, or some other suitable substrate. The first inter-level dielectric (ILD) structure 104 may, for example, be formed by chemical vapor deposition (CVD), a physical vapor deposition (PVD), atomic layer deposition (ALD), thermal oxidation, or another suitable deposition or growth process. Subsequently, a conductive wire 106 may be formed within the first ILD structure 104. In some embodiments, the conductive wire 106 may, for example be formed by a dual damascene process or a single damascene process. In further embodiments, the conductive wire 106 may, for example, be or comprise aluminum, copper, titanium nitride, tantalum nitride, tungsten, another suitable conductive material, or any combination of the foregoing.

Also shown in FIGS. 5A-5B, a first insulator layer 112 is formed over the first ILD structure 104. In some embodiments, the first insulator layer 112 may, for example, be or comprise an oxide, such as silicon dioxide, another suitable dielectric material, or any combination of the foregoing and/or may be formed to a thickness of about 1,000 Angstroms. It will be appreciated that other values for the thickness of the first insulator layer 112 are also within the scope of the disclosure. A resistive layer 114 is formed over the first insulator layer 112. In some embodiments, the resistive layer 114 may, for example, be or comprise silicon chromium and/or may be formed to a thickness of about 48 Angstroms, about 50 Angstroms, or within a range of about 30 to 60 Angstroms. It will be appreciated that other values for the thickness of the resistive layer 114 are also within the scope of the disclosure. Further, it will be appreciated that other suitable materials for the resistive layer 114 are also within the scope of the disclosure. A contact layer 502 is formed over the resistive layer 114. In further embodiments, the contact layer 502 may, for example, be or comprise titanium nitride, tantalum nitride, another suitable material or any combination of the foregoing and/or may be formed to a thickness of about 750 Angstroms. It will be appreciated that other values for the thickness of the contact layer 502 are also within the scope of the disclosure. In some embodiments, the contact layer 502 comprises a different material than the resistive layer 114. Further, a dielectric layer 504 is formed over the contact layer 502. In yet further embodiments, the dielectric layer 504 may, for example, be or comprise silicon oxynitride, silicon oxycarbide, another suitable dielectric material, or any combination of the foregoing and/or may be formed to a thickness of about 320 Angstroms, or within a range of about 300 to 350 Angstroms. It will be appreciated that other values for the thickness of the dielectric layer 504 are also within the scope of the disclosure. In some embodiments, the first insulator layer 112, the resistive layer 114, the contact layer 502, and/or the dielectric layer 504 may, for example, respectively be formed by CVD, PVD, ALD, thermal oxidation, or another suitable deposition or growth process.

Figure 6A:
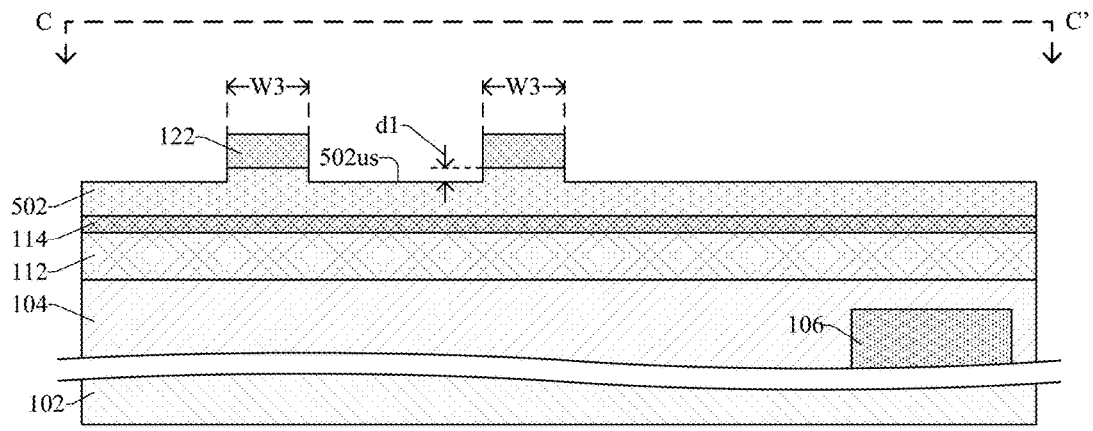
Figure 6B:
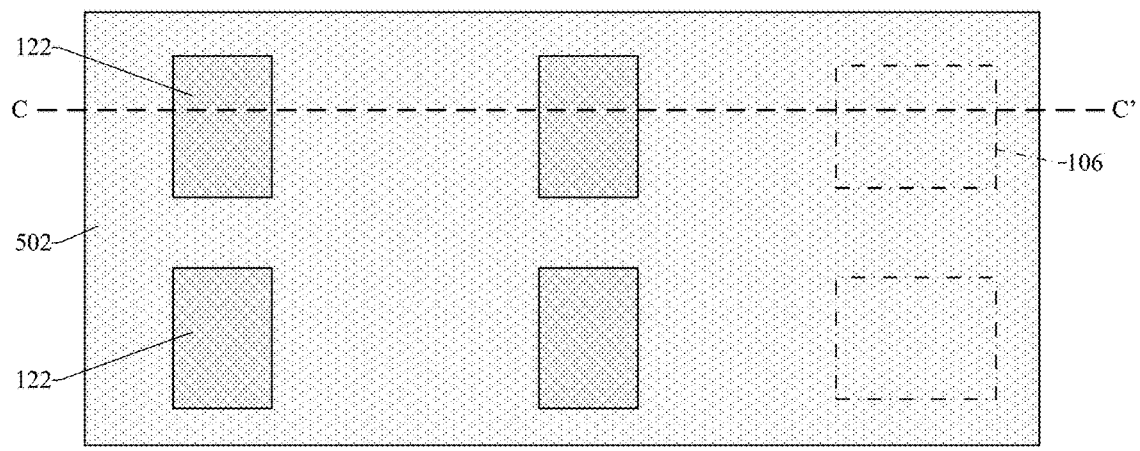

As shown in cross-sectional view 600a and top view 600b of FIGS. 6A-6B, a first patterning process is performed on the dielectric layer (504 of FIG. 6A) and the contact layer 502, thereby defining dielectric structures 122 over the resistive layer 114. In some embodiments, the first patterning process may include performing a dry etch process according to a masking layer (not shown). The first patterning process removes at least a portion of the contact layer 502, such that an upper surface 502us of the contact layer 502 is disposed beneath a top surface of the contact layer 502 by a distance d1. In some embodiments, the distance d1 is about 250 Angstroms. Further, the first patterning process defines the dielectric structures 122 such that they respectively have a width W3. In further embodiments, the width W3 is about 1.36 micrometers or within a range of about 1.3 to 1.4 micrometers.

Figure 7A:
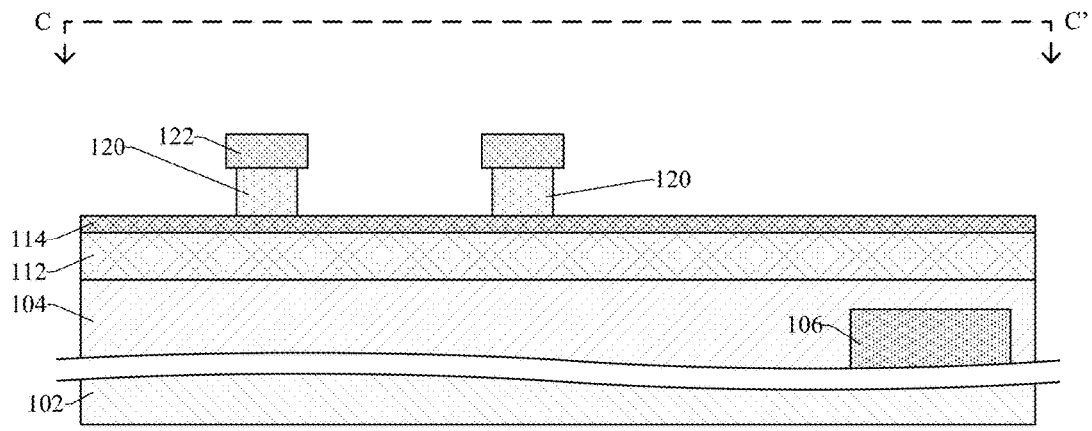
Figure 7B:
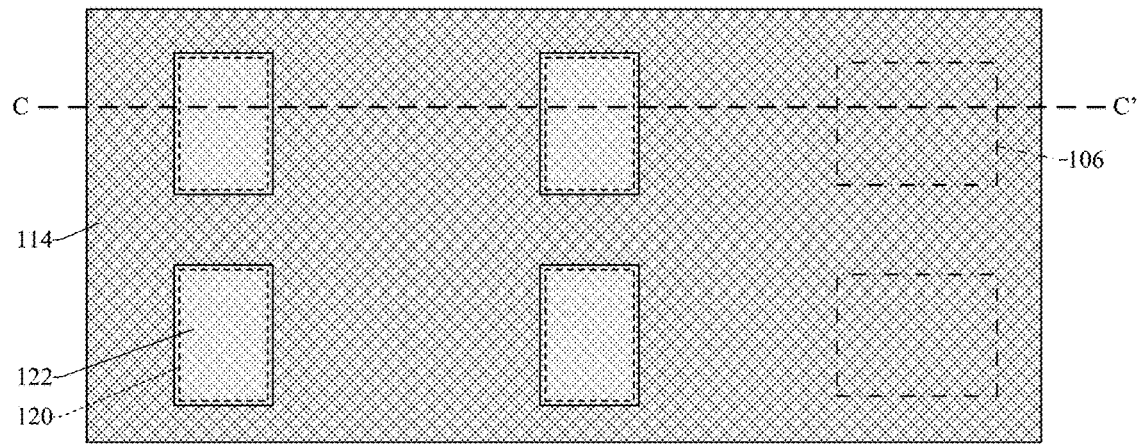

As shown in cross-sectional view 700a and top view 700b of FIGS. 7A-7B, a second patterning process is performed on the structure of FIGS. 6A-6B, thereby defining contact structures 120. In some embodiments, the second patterning process may include exposing the contact layer (502 of FIG. 6A) to one or more etchants according to the dielectric structures 122 (i.e., the dielectric structures 122 act as a masking layer during the second patterning process). In further embodiments the second patterning process may include performing a wet etch process, a dry etch process, or another suitable etching process and/or the one or more etchants may include hydrogen peroxide (e.g., $H_2O_2$). During the second patterning process the contact layer (502 of FIG. 6A), the dielectric structures 122, and the resistive layer 114 are respectively exposed to the one or more etchants (e.g., hydrogen peroxide). In some embodiments, the one or more etchants (e.g., hydrogen peroxide) have a higher etch selectivity for the contact layer (502 of FIG. 6A) than the dielectric structures 122 and the resistive layer 114. For example, during the second patterning process the contact layer (502 of FIG. 6A) may be etched at a first etching rate, the dielectric structures 122 may be etched at a second etching rate, and the resistive layer 114 may be etched at a third etching rate, such that the first etching rate is greater than the second and third etching rates. In some embodiments, outer sidewalls of the contact structures 120 may be concave as a result of the wet etch process (not shown).

Figure 8A:
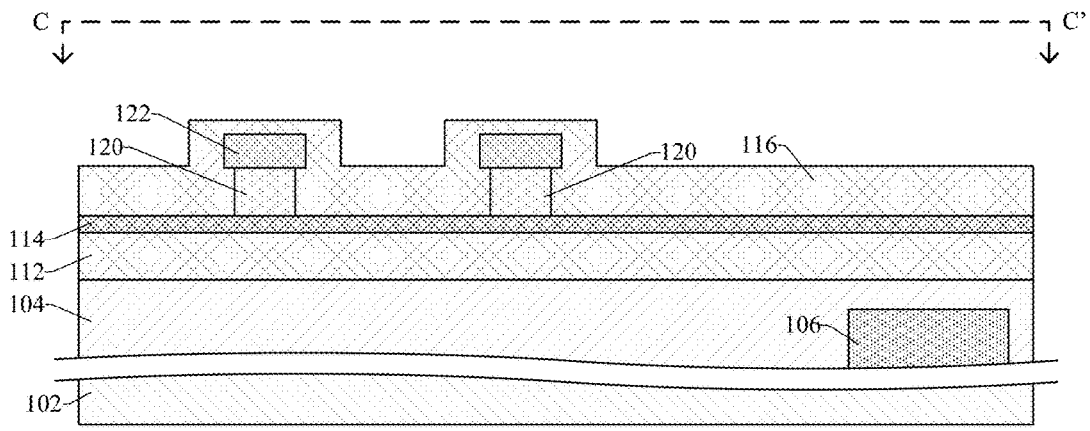
Figure 8B:
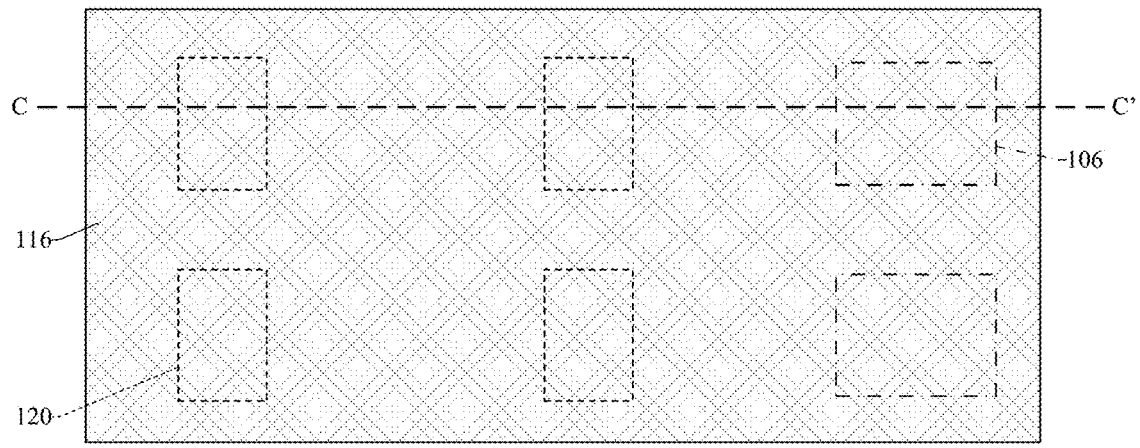

As shown in cross-sectional view 800a and top view 800b of FIGS. 8A-8B, a second insulator layer 116 is formed over the resistive layer 114. In some embodiments, the second insulator layer 116 may, for example, be or comprise an oxide, such as silicon dioxide, another suitable dielectric material, or any combination of the foregoing and/or may be formed to a thickness of about 500 Angstroms or within a range of about 450 to 550 Angstroms. It will be appreciated that other values for the thickness of the second insulator layer 116 are also within the scope of the disclosure. In further embodiments, the second insulator layer 116 may, for example, be formed by CVD, PVD, ALD, thermal oxidation, or another suitable growth or deposition process.

Figure 9A:
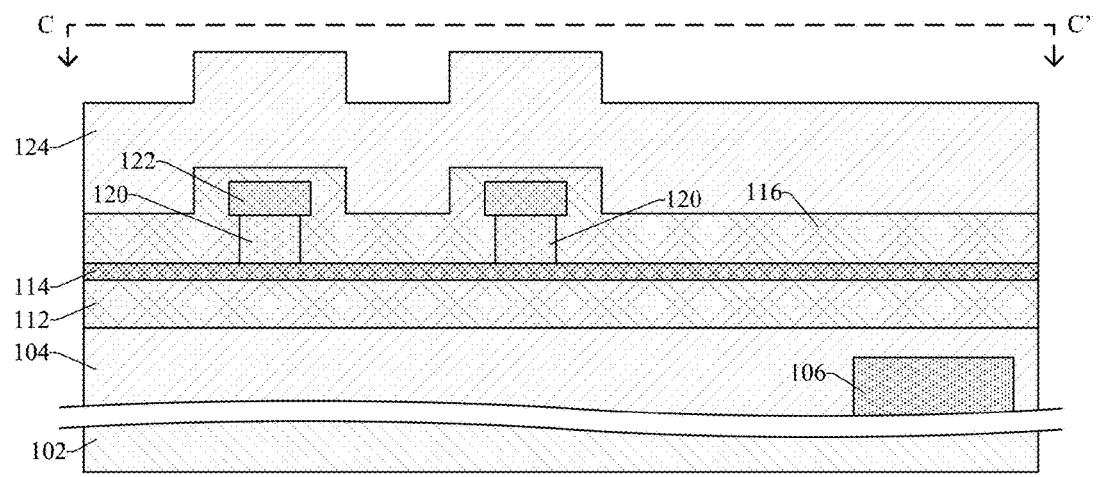
Figure 9B:
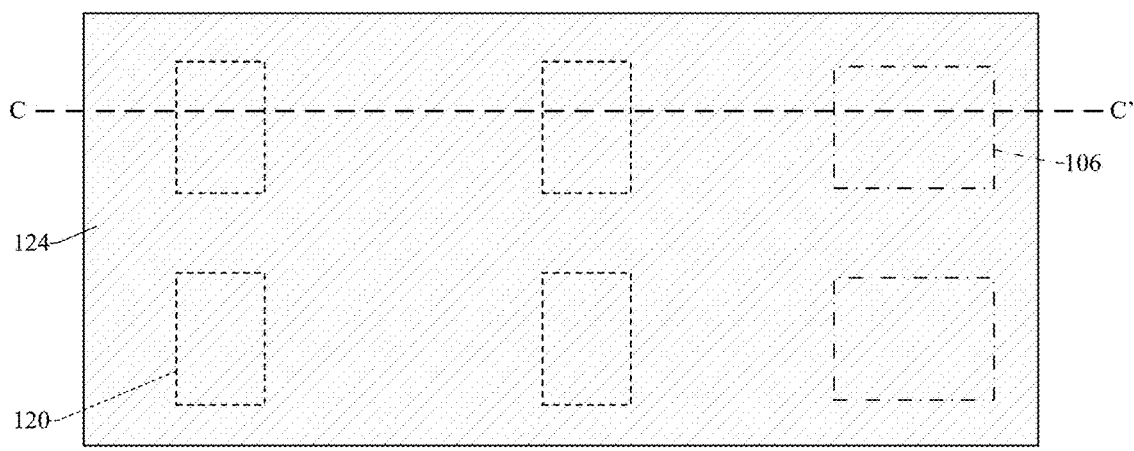

As shown in cross-sectional view 900a and top view 900b of FIGS. 9A-9B, a second ILD structure 124 is formed over the second insulator layer 116. In some embodiments, the second ILD structure 124 may, for example, be or comprise fluorosilicate glass (FSG), borophosphosilicate glass (BPSG), undoped silicate glass (USG), some other low-k dielectric material, silicon oxide, some other suitable dielectric material, or any combination of the foregoing and/or may be formed to a thickness of about 5,500 Angstrom or within a range of about 5,000 to 6,000 Angstroms. It will be appreciated that other values for the thickness of the second ILD structure 124 are also within the scope of the disclosure. In further embodiments, the second ILD structure 124 may, for example, be formed by CVD, PVD, ALD, plasma enhanced CVD (PECVD), thermal oxidation, or another suitable growth or deposition process.

Figure 10A:
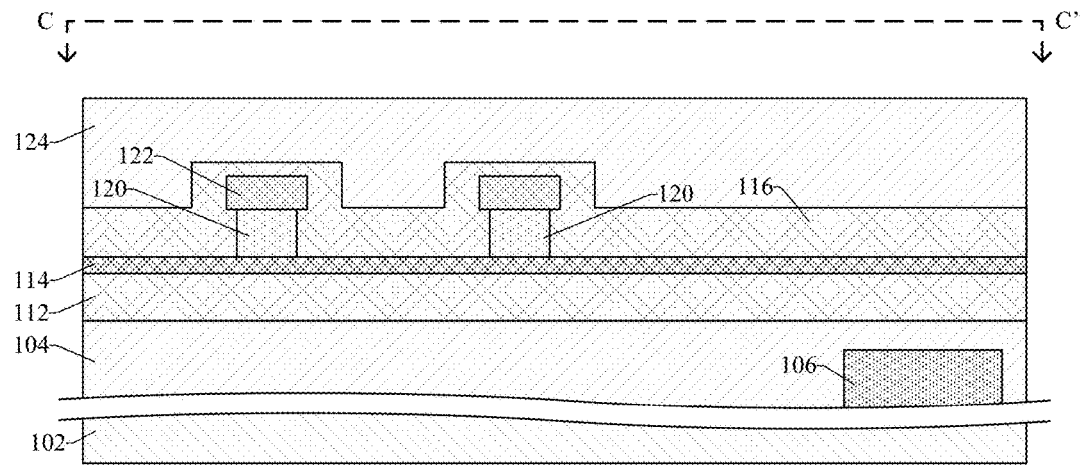
Figure 10B:
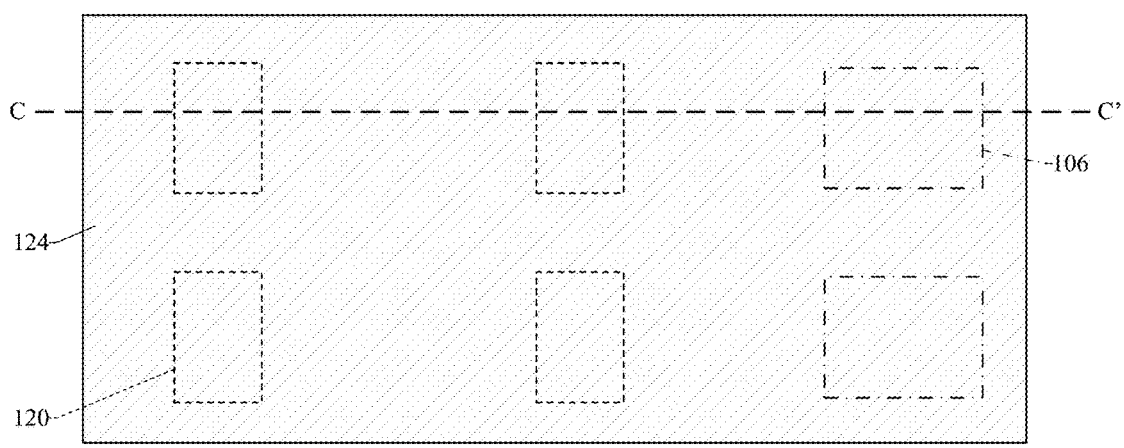

As shown in cross-sectional view 1000a and top view 1000b of FIGS. 10A-10B, a planarization process (e.g., a chemical mechanical planarization (CMP) process) is performed on the second ILD structure 124 such that a top surface of the second ILD structure 124 is substantially flat.

Figure 11A:
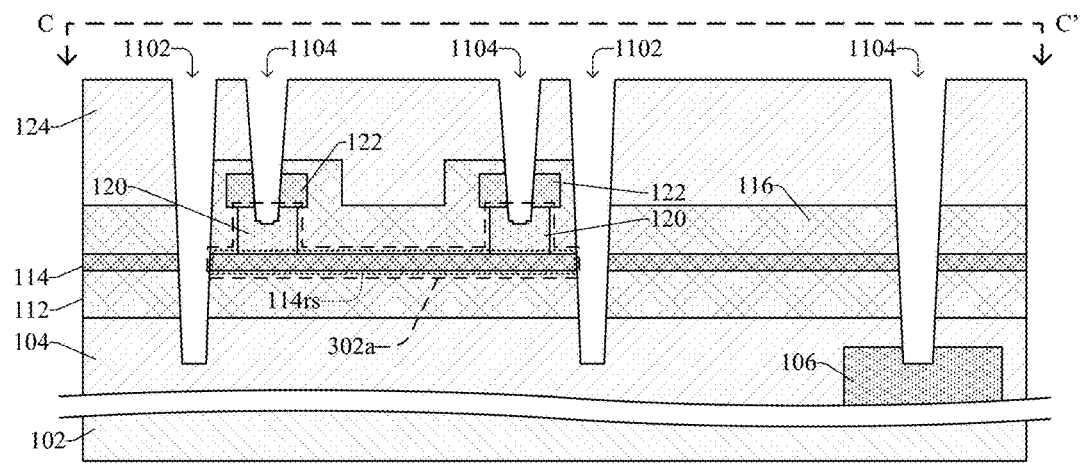
Figure 11B:
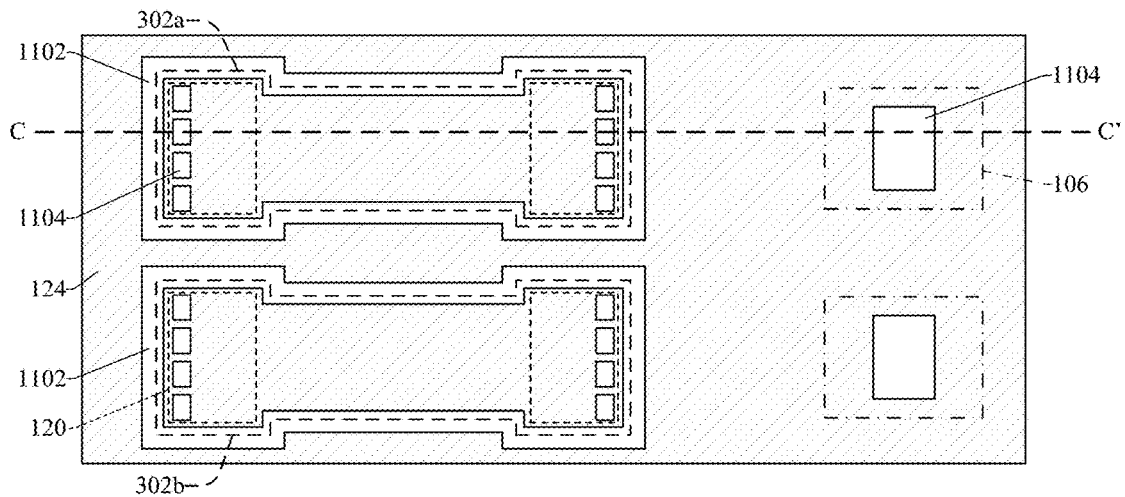

As shown in cross-sectional view 1100a and top view 1100b of FIGS. 11A-11B, a third patterning process is performed on the structure of FIGS. 10A-10B, thereby defining a plurality of ring structure openings 1102 and a plurality of via openings 1104. In some embodiments, the third patterning process includes performing one or more dry etch processes according to a masking layer (not shown). Further, the third patterning process defines a first resistor structure 302a laterally adjacent to a second resistor structure 302b. In some embodiments, the first and second resistor structures 302a, 302b respectively include a resistor segment 114rs of the resistive layer 114 and one or more conductive structures 120 overlying a corresponding resistor segment 114rs. The ring structure openings 1102 laterally enclose a corresponding resistor segment 114rs of the resistive layer 114. In some embodiments, the conductive structures 120 may function as an etch stop layer during the third patterning process such that the resistor segments 114rs of the resistive layer 114 may not be damaged during the third patterning process.

Figure 12A:
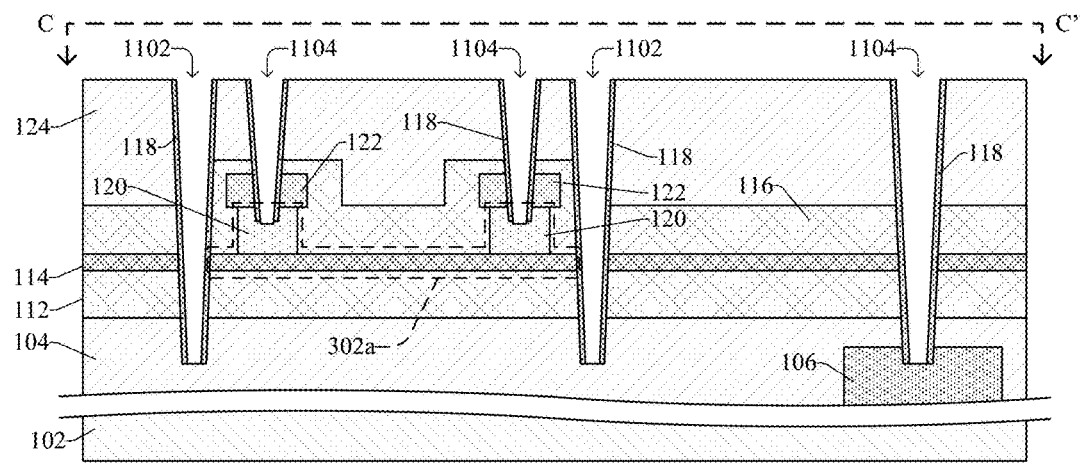
Figure 12B:
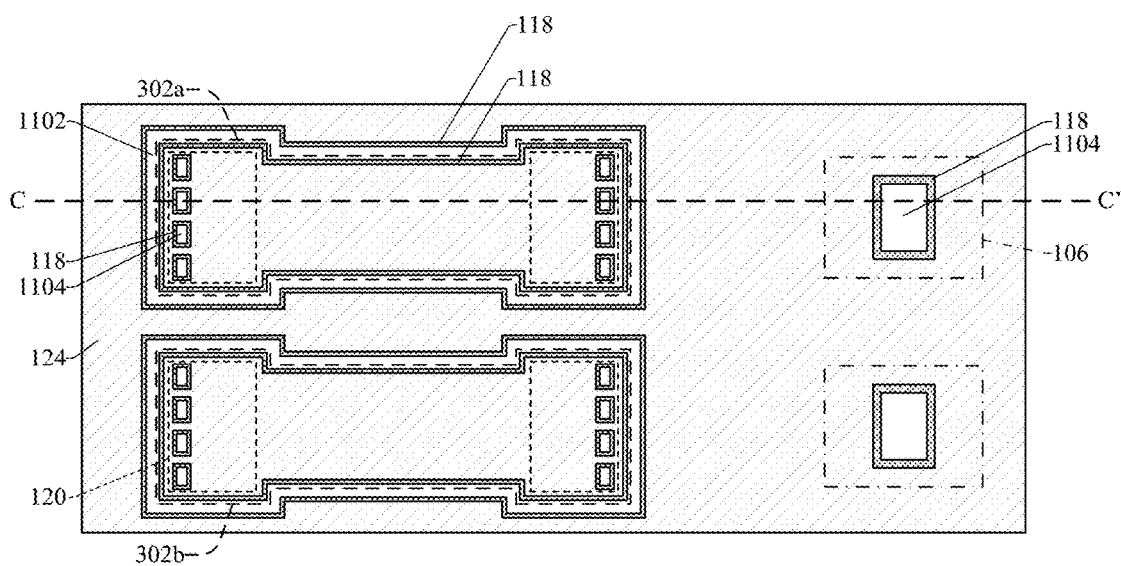

As shown in cross-sectional view 1200a and top view 1200b of FIGS. 12A-12B, a first liner 118 is formed within each of the plurality of ring structure openings 1102 and the plurality of via openings 1104. In some embodiments, a process for forming the first liner 118 may include: depositing (e.g., by CVD, PVD, etc.) a dielectric material (e.g., tetra-ethyl-ortho-silicate (TEOS) (e.g., plasma enhanced TEOS, low particle TEOS, etc.), an oxide (e.g., silicon oxide, silicon dioxide, etc.), a nitride, another suitable dielectric material, or the like) over the substrate 102, thereby lining at least a portion of each ring structure opening 1102 and each via opening 1104; and performing an etch back process to remove the dielectric material from horizontal surfaces, thereby exposing an upper surface of the contact structures 120 and/or the conductive wire 106. In yet further embodiments, a planarization process (e.g., a CMP process) may be performed into the dielectric material until the top surface of the second ILD structure 124 is reached.

Figure 13A:
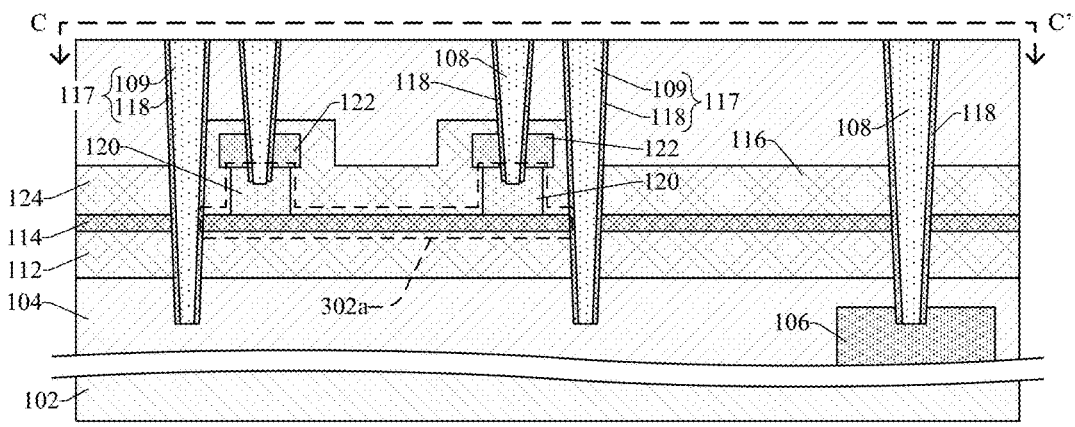
Figure 13B:
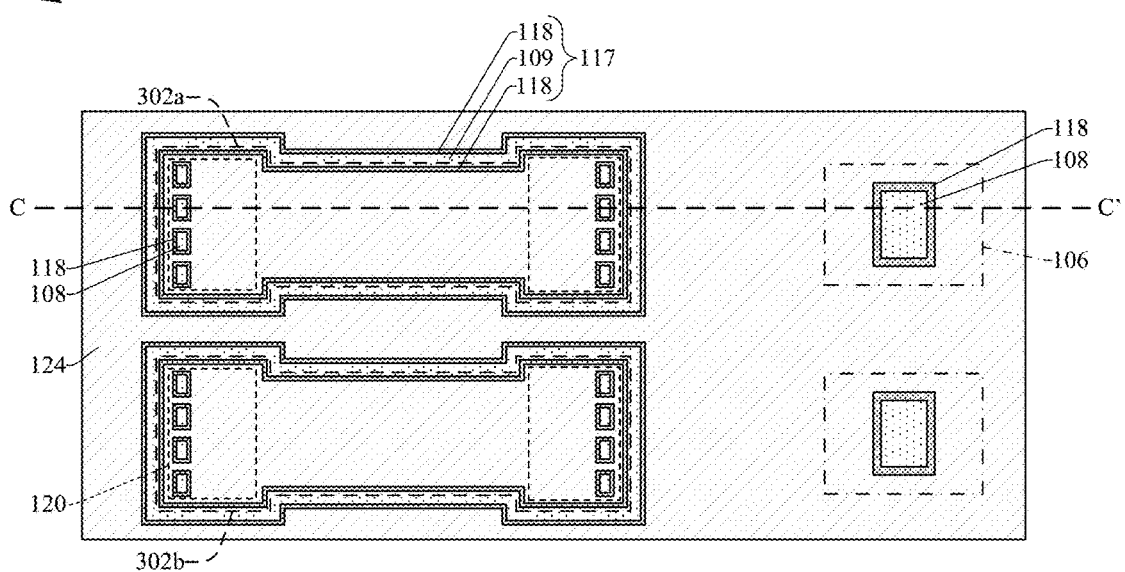

As shown in cross-sectional view 1300a and top view 1300b of FIGS. 13A-13B, conductive vias 108 and conductive bodies 109 are formed within the plurality of via openings 1104 and the plurality of ring structure openings 1102, respectively, thereby defining ring structures 117. Thus, in some embodiments, the conductive vias 108 may be formed concurrently with the ring structures 117. In some embodiments, a process for forming the conductive vias 108 and/or the conductive bodies 109 may include: depositing (e.g., by CVD, PVD, sputtering, electroplating, electroless plating, or another suitable growth or deposition process) a conductive material (e.g., aluminum, copper, tungsten, another conductive material, or any combination of the foregoing) within the ring structure openings (1102 of FIG. 12A) and the via openings (1104 of FIG. 12A); and performing a planarization process (e.g., a CMP process) into the conductive material until the top surface of the second ILD structure 124 is reached. The first liner 118 is configured to electrically isolate the conductive body 109 from a corresponding resistor segment 114rs of the resistive layer 114. In some embodiments, the conductive vias 108 are formed concurrently with at least the conductive bodies 109 of the ring structures 117. By virtue of forming the ring structures 117 with the conductive vias 108, at least one patterning process may be omitted from the fabrication process of the first and second resistor structures 302a, 302b. This, in part, decreases costs and time associated with forming the first and second resistor structures 302a, 302b. Additionally, by virtue of the ring structures 117 respectively comprising the first liner 118 and laterally enclosing the resistor segment 114rs, the resistor segment 114rs may be isolated from other segments of the resistive layer 114.

Figure 14:
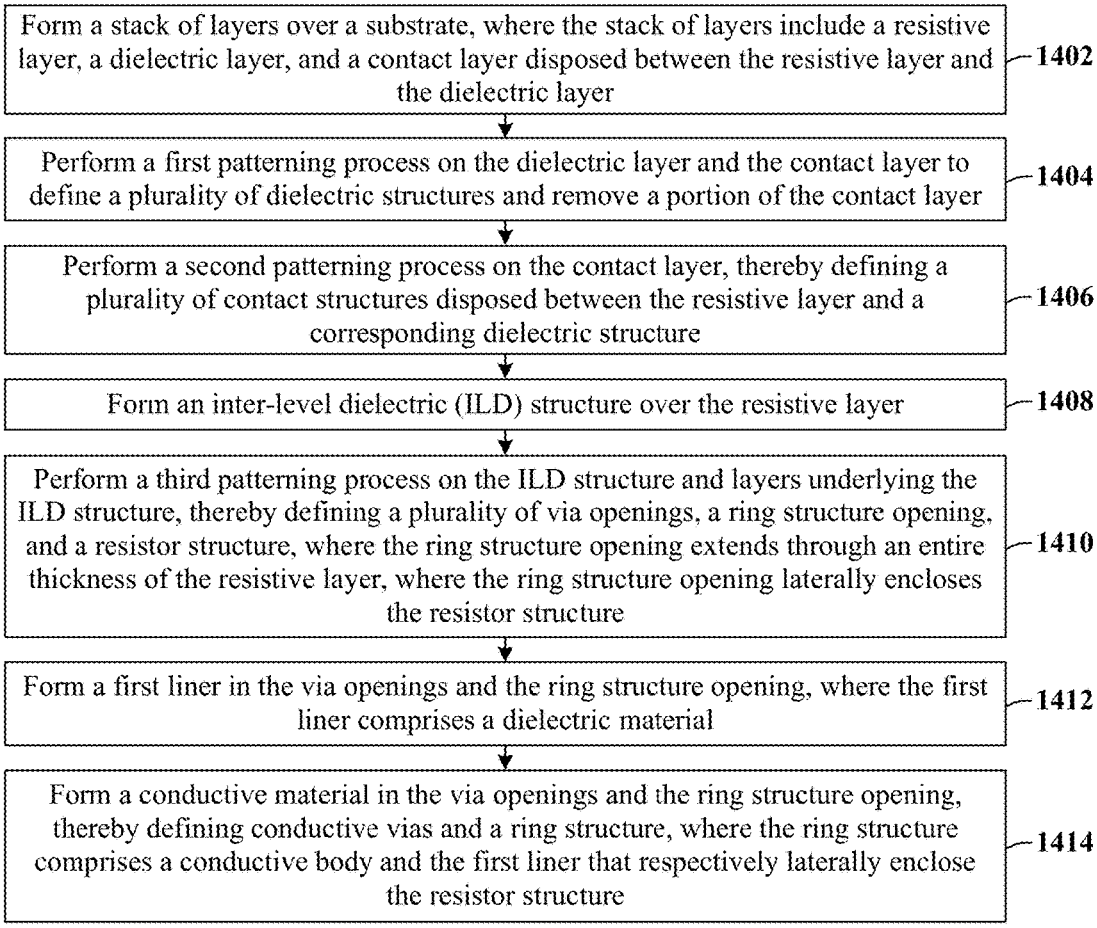
FIG. 14 illustrates a flow chart of some embodiments of a method for forming an integrated chip having a resistor structure overlying a substrate.

FIG. 14 illustrates a method 1400 of forming an integrated chip having a resistor structure overlying a substrate. Although the method 1400 is illustrated and/or described as a series of acts of events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1402, a stack of layers is formed over a substrate. The stack of layers includes a resistive layer, a dielectric layer, and a contact layer disposed between the resistive layer and the dielectric layer. FIGS. 5A-5B illustrate various views of some embodiments corresponding to act 1402.

At act 1404, a first patterning process is performed on the dielectric layer and the contact layer to define a plurality of dielectric structures and remove a portion of the contact layer. FIGS. 6A-6B illustrate various views of some embodiments corresponding to act 1404.

At act 1406, a second patterning process is performed on the contact layer, thereby defining a plurality of contact structures disposed between the resistive layer and a corresponding dielectric structure. FIGS. 7A-7B illustrate various views of some embodiments corresponding to act 1406.

At act 1408, an inter-level dielectric (ILD) structure is formed over the resistive layer. FIGS. 8A-8B through 10A-10B illustrate various views of some embodiments corresponding to act 1408.

At act 1410, a third patterning process is performed on the ILD structure and layers underlying the ILD structure, thereby defining a plurality of via openings, a ring structure opening, and a resistor structure. The ring structure opening extends through an entire thickness of the resistive layer, where the ring structure opening laterally encloses the resistor structure. FIGS. 11A-11B illustrate various views of some embodiments corresponding to act 1410.

At act 1412, a first liner is formed in the via openings and the ring structure opening, where the first liner comprises a dielectric material. FIGS. 12A-12B illustrate various views of some embodiments corresponding to act 1412.

At act 1414, a conductive material is formed in the via openings and the ring structure opening, thereby defining conductive vias and a ring structure. The ring structure comprises a conductive body and the first liner that respectively laterally enclose the resistor structure. FIGS. 13A-13B illustrate various views of some embodiments corresponding to act 1414.

Accordingly, in some embodiments, the present disclosure relates to a resistor structure comprising a resistor segment of a resistive layer and conductive structures overlying the resistor segment, where a ring structure laterally encloses the resistor structure.

In some embodiments, the present application provides an integrated chip, including: a substrate; a resistive layer overlying the substrate; a resistor structure overlying the substrate, wherein the resistor structure includes: a resistor segment of the resistive layer; conductive structures overlying the resistor segment; and a ring structure enclosing the resistor structure, wherein the ring structure extends continuously from a first point above the conductive structures to a second point below a bottom surface of the resistive layer.

In some embodiments, the present application provides a semiconductor structure, including: a substrate; a resistive layer overlying the substrate; a resistor structure overlying the substrate, wherein the resistor structure comprises a resistor segment of the resistive layer, contact structures overlying the resistor segment, and dielectric structures overlying the contact structures; and an isolation structure continuously wrapping around an outer perimeter of the resistor segment, wherein the isolation structure comprises a conductive body and a first liner extending along opposing sidewalls of the conductive body.

In some embodiments, the present application provides a method for forming an integrated chip, the method including depositing a resistive layer over a substrate, wherein the resistive layer comprises a first material; forming a conductive structure over the resistive layer, wherein the conductive structure comprises a second material different than the first material; forming an inter-level dielectric (ILD) structure over the conductive structure; patterning the ILD structure and the resistive layer to define a plurality of via openings and a ring structure opening, such that the ring structure opening laterally encloses a resistor segment of the resistive layer, wherein the ring structure opening extends from an upper surface of the ILD structure to a point below the resistive layer; forming a plurality of conductive vias in the plurality of via openings; and forming a ring structure within the ring structure opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a substrate;
a resistive layer overlying the substrate;
a resistor structure overlying the substrate, wherein the resistor structure comprises:
    a resistor segment of the resistive layer;
    conductive structures overlying the resistor segment; and
a ring structure laterally enclosing the resistor structure, wherein the ring structure extends continuously from a first point above the conductive structures to a second point below a bottom surface of the resistive layer.

2. The integrated chip of claim 1, wherein the ring structure comprises:
a conductive body that surrounds the resistor segment of the resistive layer; and
a dielectric liner disposed along sidewalls of the conductive body to separate the conductive body from the resistive layer, wherein the conductive body and the dielectric liner extend through the resistive layer.

3. The integrated chip of claim 2, wherein the conductive body comprises tungsten and the dielectric liner comprises tetra-ethyl-ortho-silicate (TEOS).

4. The integrated chip of claim 2, further comprising:
a conductive via directly overlying a conductive wire, wherein the conductive via extends continuously from the first point to the second point, wherein the conductive via is laterally offset from the ring structure by a non-zero distance; and
wherein the resistive layer continuously extends from the dielectric liner to the conductive via, such that the resistive layer laterally encloses the conductive via.

5. The integrated chip of claim 2, further comprising:
a plurality of conductive vias directly overlying a corresponding conductive structure, wherein the conductive vias respectively extend continuously from the first point to a third point disposed between the first and second points; and
wherein the dielectric liner continuously extends along opposing sidewalls of each conductive via.

6. The integrated chip of claim 5, wherein the plurality of conductive vias are vertically separated from the resistor segment of the resistive layer by the conductive structures.

7. The integrated chip of claim 1, wherein the conductive structures comprise a first material and the resistive layer comprise a second material different than the first material.

8. The integrated chip of claim 7, wherein the first material is titanium nitride and the second material is silicon chromium.

9. The integrated chip of claim 1, further comprising:
a plurality of dielectric structures overlying a corresponding conductive structure, wherein a width of a dielectric structure in the plurality of dielectric structures is greater than a width of the corresponding conductive structure.

10. A semiconductor structure, comprising:
a substrate;
a resistive layer overlying the substrate;
a resistor structure overlying the substrate, wherein the resistor structure comprises a resistor segment of the resistive layer, contact structures overlying the resistor segment, and dielectric structures overlying the contact structures; and
an isolation structure continuously wrapping around an outer perimeter of the resistor segment, wherein the isolation structure comprises a conductive body and a first liner extending along opposing sidewalls of the conductive body.

11. The semiconductor structure of claim 10, wherein the isolation structure continuously extends through a thickness of the resistive layer.

12. The semiconductor structure of claim 10, wherein the first liner comprises a first dielectric material and the dielectric structures comprise a second dielectric material different than the first dielectric material.

13. The semiconductor structure of claim 10, wherein the resistor segment of the resistive layer is laterally separated from a peripheral region of the resistive layer by the isolation structure.

14. The semiconductor structure of claim 10, wherein a thickness of the resistive layer is less than a thickness of the contact structures.

15. The semiconductor structure of claim 10, wherein the contact structures include a first contact structure and a second contact structure, wherein the first contact structure is laterally offset from the second contact structure by a non-zero distance, wherein the resistor segment continuously extends along the non-zero distance.

16. The semiconductor structure of claim 10, wherein the isolation structure comprises a first outer region, a second outer region, and a center region disposed between the first and second outer regions, wherein the first and second outer regions have a first width and the center region has a second width less than the first width.

17. A semiconductor structure, comprising:
a substrate;
a conductive wire overlying the substrate;
a resistive layer overlying the substrate, wherein a peripheral segment of the resistive layer directly overlies the conductive wire;
a resistor structure overlying the substrate, wherein the resistor structure comprises a resistor segment of the resistive layer, a first contact structure overlying the resistor segment, and a second contact structure overlying the resistor segment; and
an isolation structure laterally enclosing the resistor segment, wherein the isolation structure laterally separates the resistor segment of the resistive layer from the peripheral segment of the resistive layer, wherein the isolation structure continuously extends from above the resistive layer to a point below a top surface of the conductive wire.

18. The semiconductor structure of claim 17, wherein the first contact structure directly overlies a first outer region of the resistor segment and the second contact structure directly overlies a second outer region of the resistor segment, wherein a center region of the resistor segment continuously extends from the first outer region to the second outer region, wherein a width of the resistor segment discretely decreases from the first outer region to the center region, and wherein the width of the resistor segment discretely increases from the center region to the second outer region.

19. The semiconductor structure of claim 17, wherein the isolation structure comprises a dielectric liner that directly contacts an outer perimeter of the resistor segment of the resistive layer.

20. The semiconductor structure of claim 17, wherein a top surface of the isolation structure is disposed vertically above a top surface of the first contact structure.

* * * * *